United States Patent [19]
So et al.

[11] Patent Number: 5,935,255
[45] Date of Patent: Aug. 10, 1999

[54] CPU CORE TO BUS SPEED RATIO DETECTION

[75] Inventors: K. C. So, San Jose; Rajesh Manapat, Sunnyvale, both of Calif.

[73] Assignee: Cypress Semiconductor Corp., San Jose, Calif.

[21] Appl. No.: 08/606,447

[22] Filed: Feb. 23, 1996

[51] Int. Cl.$^6$ ...................................... G06F 1/04
[52] U.S. Cl. ............................. 713/400; 713/500
[58] Field of Search ........................... 395/551, 555, 395/556, 557, 558, 559, 560, 309

[56] References Cited

U.S. PATENT DOCUMENTS 5,459,855  10/1995  Lelm ................................. 395/551
5,471,587  11/1995  Fernando ........................... 395/309
5,630,107   5/1997  Caemean et al. ................... 395/560

*Primary Examiner*—Dennis M. Butler
*Attorney, Agent, or Firm*—Maiorana & Acosta, P.C.

[57] ABSTRACT

A mechanism for determining a CPU's core-to-bus frequency ratio in a computer system using the CPU itself, rather than an external agent, to sample the external pins on RESET and latch their core/bus frequency ratio information into an internal register. By accessing the information in this internal register, it is possible for the BIOS or any other software to read the internal to external clock ratios and optimize the performance of the system.

16 Claims, 1 Drawing Sheet

CPU CORE TO BUS SPEED RATIO DETECTION

BACKGROUND OF THE INVENTION

1. Field of the Invention

The present invention relates to microprocessors and more particularly to a method and mechanism for directly determining a CPU's bus-to-core frequency ratio in a computer system.

2. Prior Art

Most current microprocessors have a mechanism by which they can set their bus-to-core frequency ratio. This function helps the microprocessor to run faster than the computer system in which it is operating by having the CPU run at a higher clock frequency internally than the operating frequency on the bus. The ratio is set by using one or more external pins which the CPU samples at RESET. But, presently the CPU does not provide any mechanism by which the software can determine the ratio. The ratio relationship can be represented by the equation:

$$F = n \times f$$

where

F=core frequency f=bus frequency n=core/bus frequency ratio, and a given CPU normally has only a certain number of core-to-bus frequency ratios at which it can operate.

One present method for determining a CPU's bus-to-core frequency ratio involves guessing about the value of n. More particularly, on power up, the CPU will be executing codes entirely out of its internal cache (also known as Level-1 cache). Certain instruction sequences are repeatedly executed, typically in a program loop reside entirely inside Level-1 cache at core frequency F. The number N of such instructions successfully completed within a predetermined time T is counted. Time T can be set to some known value that is platform independent. For example, in a PC/AT or compatible system, the timer (8254C) is reset to count 0 through some I/O instruction, and the counter begins to count up. Then N instructions are executed entirely within the CPU internal cache. After these N instructions are completed, the value of the 8254 counter is read. Knowing the frequency of the clock to the 8254 counter and the count, the time required to complete the N instructions can be easily determined. The number N is directly related to the core frequency F of the CPU. A relation between N and F can therefore be determined experimentally (e.g., record N while varying F) and will be used by the BIOS to determine the core frequency F in the target system. Because the CPU can have only a certain number of core-to-bus frequency ratios, the BIOS looks at the standard ratios and makes a guess as to what the bus frequency and the ratio n actually are. Thus, for instance, in the Pentium CPU, the BIOS can allow n to be either 1.5 or 2. Accordingly, if the BIOS determines that the CPU core is running at F=100 MHz, then the CPU bus frequency f could be either 66 MHz (n=1.5) or 50 MHz (n=2). Unfortunately, the bus frequency f is also directly related to the performance of other systems so that guessing is not an optimum method for efficient operation. A DRAM controller may be able to run 6-3-3-3 at 66 MHz and 5-2-2-2 at 50 MHz, where 50 and 66 MHZ is the CPU bus frequency. The expression 6-3-3-3 means the first data transaction is completed in 6 bus clock pulses and each of the next three data transactions is completed in 3 bus clock pulses. The same applies to the 5-2-2-2 expression. This burst timing is set through certain timing registers as part of the DRAM controller during power on self-test, that is, initialization. Without knowing n (1.5 or 2), the BIOS is forced to assume that the bus speed is the higher one (e.g., 66 MHz) and set the DRAM timing to 6-3-3-3. If the assumption is right, then the DRAM will be running at 6-3-3-3 at 66 MHz. If the guess is wrong, then the DRAM will be running at 6-3-3-3 at 50 MHz. Clearly, in this case the DRAM is not running at its highest performance. Nevertheless, the system is a stable one. However, if the BIOS sets the timing register to the alternate setting (i.e., 5-2-2-2), a potential system failure may occur. Clearly, if the actual bus frequency is 50 MHz, the DRAM timing is optimized, but, if the bus frequency is 66 MHz, then the DRAM will be running at 5-2-2-2 at 66 MHz and the DRAM timing specification is violated and failure may result. It will therefore be seen that it is imperative to know the core/bus frequency ratio in order to avoid failure and to optimize system performance.

Another approach to determining the CPU's core-to-bus frequency ratio is to have an external agent, e.g., a Chipset, sample the external CPU pins which set the clock frequency ratio and latch the values into a register, which can then be read by the BIOS to determine the ratio. This arrangement may be expressed diagrammatically as shown in FIG. 1. As seen in the Figure, the ratios may be set as follows:

Binary value of A[1..0]=f(n), e.g.,

00=1.5

01=2

10=2.5

11=3

The disadvantage of this approach is that it is necessary to use e.g., two pins (the number of pins equivalent to the number of pins used by the CPU to do this function) on the external agent (Chipset) to determine the ratio. While this approach may work very well in determining the ratio n, it requires extra external hardware in terms of pins used by external agents (Chipsets), which additions is preferably avoided.

Problem to be Solved

It is accordingly a problem in the microprocessor art to accurately and efficiently determine a CPU's core-to-bus frequency ratio.

Objects

It is therefore an object of the present invention to provide a method and mechanism for accurately and efficiently determining the CPU core-to-bus frequency ratio in a computer system.

It is another object of the invention to provide a method and mechanism on current CPUs to accurately and efficiently determine the CPU core-to-bus frequency ratio.

It is further object of the invention to provide a direct method and mechanism on current CPUs to accurately and efficiently determine and use the core-to-bus frequency ratio in order to optimize computer system performance.

SUMMARY OF THE INVENTION

The present invention involves determining a CPU's core-to-bus frequency ratio in a computer system using the CPU itself, rather than an external agent, to sample the external pins upon RESET and latch them into an internal register. With the provision of a method to access this internal register the BIOS or any other software can read the internal to external clock ratios and optimize the performance of the system. Accordingly, the CPU provides a register internally that is initialized by the values sampled to the external inputs during RESET, which register samples and latches the core/bus frequency ratio pins. The latching action may occur in the falling edge of the RESET signal. This information will eventually be read by a suitable computer system means, such as an instruction, so that other software, e.g., the BIOS or operating systems, can determine the external bus speed. The instruction in question does not go out to sample and latch the bus frequency ratio information. It just uses the information in the latch. The latch may be part of the "instruction" if the definition of the instruction is well defined. Essentially, there is a latch that conveys the CPU's core-to-bus frequency ratio to other devices (BIOS, O.S., etc.). The instruction can be a part of some program and can be anywhere in the system.

DETAILED DESCRIPTION OF A PREFERRED EMBODIMENT

Figure 1:
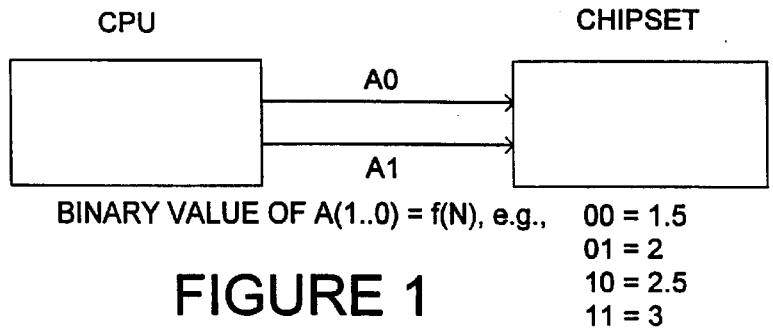
FIG. 1 is a block diagram of a prior art system for determining a CPU's core-to-bus frequency ratio in a computer system using an external agent.
Figure 2:
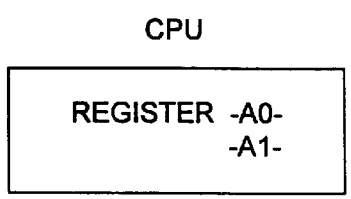
FIG. 2 is a block diagram of a system for determining the CPU core-to-bus frequency ratio in a computer system according to the invention.

The present invention involves a method and mechanism for determining a CPU's core-to-bus frequency ratio in a computer system using the CPU itself, rather than an external agent, to sample the appropriate external pin or pins on RESET and latch their information into an internal register. FIG. 2 illustrates this inventive implementation as compared with the approach shown in FIG. 1. The provision of a method to access the internal register, enables the BIOS, or any other software, to read the internal to external clock ratios and optimize the performance of the system. Thus, the invention embodies the use of a register, internal to the CPU, that is initialized by the values read on the external inputs during RESET. This register receives information latched from the sampling of the core/bus frequency ratio pins. The latching action may occur in the falling edge of RESET and the information latched is available to eventually be read by a suitable means, such as an instruction, so that other software, e.g., BIOS or operating systems, can determine the external bus speed. The instruction in question does not go out to sample and latch the core-to-bus frequency ratio information, but merely uses the information in the latch. The latch may be part of the "instruction" if the definition of an instruction is well defined. Hence, there is a latch that ultimately conveys the CPU's core-to-bus frequency ratio to other devices (BIOS, O.S., etc.). The instruction to read this latch can be stored in Level-1 cache or elsewhere.

By way of a specific example, in the Pentium chip, produced by Intel Corp., there is an instruction called CPUID (op code 0F A2) that can be easily extended to cover the CPU core-to-bus ratio value. After execution of the CPUID instruction, the following information is contained in register EAX:

EAX|3..0|- Stepping ID
EAX|17:41|- Model
EAX|11:81|- Family
EAX|31:12|- Reserved In accordance with the invention, bits 12 and 13 can be used to reflect the value of BF0 and BF1, i.e., EAX|13:12|- Core/Bus frequency ratio pins values (BF1, BF0)
EAX|31:14|- Reserved Access can then be provided to this register to permit the BIOS or other software to read the internal to external clock ratio, using the extend CPUID instruction available in the Pentium CPU, and transferring the outputs of the latch to EAX bits 13 and 12 when the CPUID op code is decoded.

Figure 3:
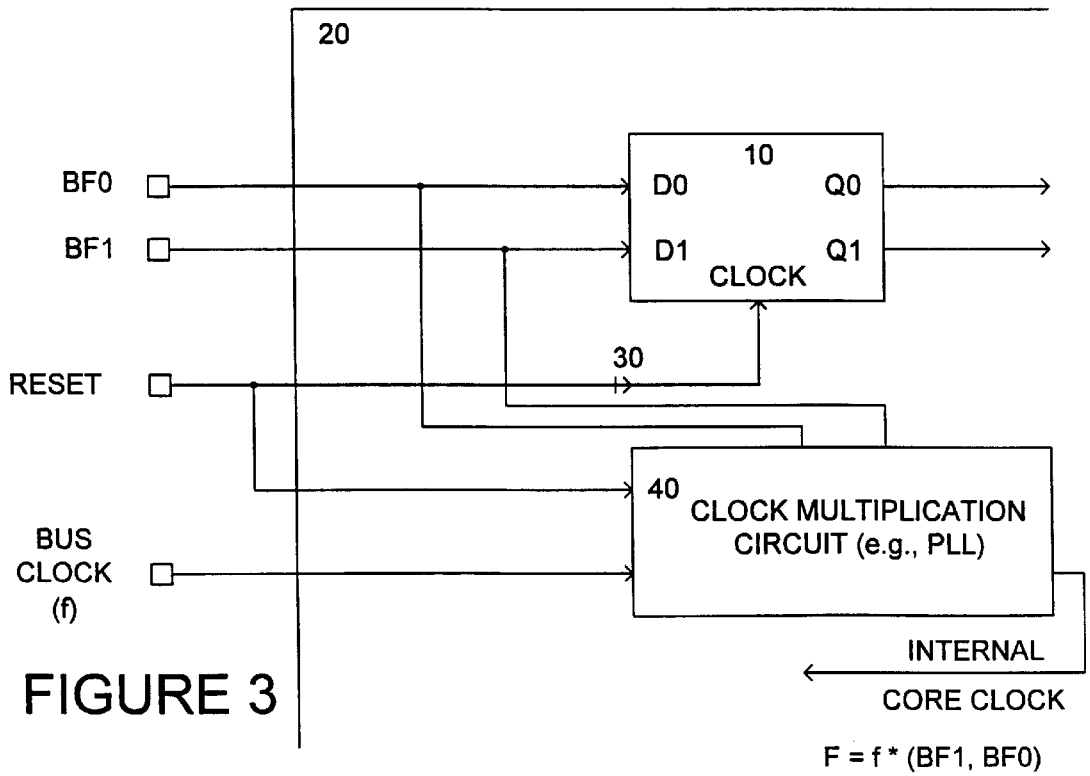
FIG. 3 is a schematic diagram of an implementing circuit in accordance with the invention.

FIG. 3 is a schematic diagram of an implementing circuit in accordance with the invention. As seen in the Figure, a flip-flop 10 within the CPU 20 receives BF0 and BF1 pin signals on its inputs D0 and D1 and through an inverting buffer 30 receives a RESET clock signal. The BF0 and BF1 signals are also input, e.g., on the falling edge of RESET, to a Clock Multiplication Circuit 40 (e.g., a Phased Lock Loop) along with an input from the Bus Clock. The PLL 40 then generates an internal core clock signal, the frequency of which is F=f* (BF1, BF0), where f=Bus Clock frequency, (BF1, BF0)=a value depending on the logic levels at pins BF1 and BF0 at the falling edge of RESET. Flip Flop 10 holds the logic values of BF1 and BF0. As noted, this register 10 may then be accessed, e.g., using the extend CPUID instruction available in the Pentium CPU, by the BIOS or other software to determine the CPU's core-to-bus frequency ratio and select the operating ratio for optimum performance.

What is claimed is:

1. A method for determining a CPU's core-to-bus frequency ratio in a computer system, comprising the steps of:
   asserting a reset signal;
   sampling, with said CPU, at least one pin external to the CPU while said reset signal is asserted to obtain core-to-bus frequency ratio information;
   latching said information into a register in said CPU; and
   accessing said information in said register by one or more components in said computer system.

2. The method of claim 1 wherein said latching step is performed in the falling edge of the reset signal.

3. The method of claim 2 wherein said register comprises a flip-flop.

4. The method of claim 3 wherein said reset signal is coupled to said flip-flop circuit by a buffer.

5. The method of claim 1 wherein said accessing step comprises storing and retrieving an instruction from said register.

6. The method of claim 5 wherein said instruction comprises a software instruction in a computer readable medium.

7. The method of claim 5 wherein said accessing step comprises providing said core-to-bus frequency ratio to a system BIOS.

8. A mechanism for determining a CPU's core-to-bus frequency ratio in a computer system, comprising:
   means for asserting a reset signal;
   means on said CPU for sampling at least one pin external to the CPU while said reset signal is asserted, said pin providing core-to-bus frequency ratio information;
   means in said CPU for storing said ratio information; and
   means for accessing said ratio information in said storage means by one or more components in said computer system.

9. The mechanism of claim 8 wherein said storage means comprises a flip-flop.

10. The mechanism of claim 8 wherein said latching means latches said ratio information into said register on a falling edge of said reset signal.

11. The mechanism of claim 9 further comprising a buffer for coupling said reset signal and said flip-flop circuit.

12. The mechanism of claim 8 wherein said ratio comprises a CPU instruction.

13. The mechanism of claim 8 wherein said ratio comprises at least part of a system instruction.

14. The mechanism of claim 8 wherein said ratio comprises one or more system instructions.

15. The method of claim 14 wherein said accessing means comprises means for using said one or more system instructions to provide said core-to-bus frequency ratio to a system BIOS.

16. A mechanism for determining a CPU's core-to-bus frequency ratio in a computer system, comprising:

a first circuit configured to assert a reset signal;

an access point on said CPU for sampling at least one external pin while said reset signal is asserted, said at least one external pin providing core-to-bus frequency ratio information;

a register in said CPU for storing said ratio information;

a latch circuit, coordinated with said reset signal for latching said ratio information into said register; and a second circuit for accessing said ratio information in said register by components in said computer system.

* * * * *